United States Patent
Manabe et al.

(10) Patent No.: US 7,385,265 B2
(45) Date of Patent: Jun. 10, 2008

(54) HIGH DIELECTRIC CONSTANT MOSFET DEVICE

(75) Inventors: Kenzo Manabe, Tokyo (JP); Kazuhiko Endo, Tokyo (JP)

(73) Assignee: NEC Corporation (JP)

( * ) Notice: Subject to any disclaimer, the term of this patent is extended or adjusted under 35 U.S.C. 154(b) by 354 days.

(21) Appl. No.: 10/489,522

(22) PCT Filed: Mar. 27, 2003

(86) PCT No.: PCT/JP02/09363
§ 371 (c)(1),
(2), (4) Date: Sep. 3, 2004

(87) PCT Pub. No.: WO03/026019
PCT Pub. Date: Mar. 27, 2003

(65) Prior Publication Data
US 2005/0017319 A1    Jan. 27, 2005

(30) Foreign Application Priority Data
Sep. 12, 2001   (JP)   ............... 2001-276416

(51) Int. Cl.
*H01L 29/94* (2006.01)
(52) U.S. Cl. ............... 257/410; 257/411; 257/E29.132; 257/E29.162; 438/591; 438/287; 438/785
(58) Field of Classification Search ............... 257/324, 257/257, 410, 288
See application file for complete search history.

(56) References Cited

U.S. PATENT DOCUMENTS

| | | | | |
|---|---|---|---|---|
| 6,013,553 A | | 1/2000 | Wallace et al. ............. 438/287 |
| 6,246,076 B1 | * | 6/2001 | Lipkin et al. ................. 257/77 |
| 6,297,538 B1 | * | 10/2001 | Kolodzey et al. ........... 257/410 |
| 6,313,503 B1 | * | 11/2001 | Lee et al. .................... 257/324 |
| 6,383,873 B1 | * | 5/2002 | Hegde et al. ............... 438/287 |
| 2004/0071879 A1 | * | 4/2004 | Callegari et al. ....... 427/255.28 |
| 2005/0156257 A1 | * | 7/2005 | Bojarczuk et al. .......... 257/410 |

(Continued)

FOREIGN PATENT DOCUMENTS

JP          58033841           2/1983

(Continued)

OTHER PUBLICATIONS

"Boron Penetration in P+ Polycrystalline-Si/Al2O3/Si Metal-Oxide-Semiconductor System" Park et al., Applied Physics Letters, vol. 77, No. 13, 2000, pp. 2207-2209.

(Continued)

*Primary Examiner*—Jerome Jackson
*Assistant Examiner*—Paul Budd
(74) *Attorney, Agent, or Firm*—Hayes Soloway P.C.

(57) ABSTRACT

A semiconductor device has an MIS (metal-insulating film-semiconductor) structure, and a film mainly containing Al, O, and N atoms is used on a semiconductor. Alternatively, a semiconductor device has an MIS structure, and a film mainly containing Al, O, and N atoms is provided as a gate insulating film on a channel region between a source and a drain. Characteristics required of a gate insulating film of a 0.05 μm-gate-length-generation semiconductor transistor are satisfied. In particular, no fixed charge is included in the film, and impurity diffusion is reduced.

37 Claims, 8 Drawing Sheets

U.S. PATENT DOCUMENTS

2005/0167723 A1* 8/2005 Forbes et al. ............... 257/306

FOREIGN PATENT DOCUMENTS

| JP | 1023571 | 1/1989 |
| JP | 3027565 | 2/1991 |
| JP | 7193147 | 7/1995 |
| JP | 10178170 | 6/1998 |
| JP | 2001077355 | 3/2001 |
| JP | 2001168325 | 6/2001 |
| JP | 2001250823 | 9/2001 |
| JP | 2002184973 | 6/2002 |
| JP | 2002299607 | 10/2002 |
| WO | WO 00/13236 | 3/2000 |

OTHER PUBLICATIONS

"80 nm Ploy-Silicon Gated n-FET's wtih Ultra-Thin AL2O3 Gate Dielectric for ULSI Applications" Buchanan et al., IBM Research, IEEE, 2000, pp. 1-4.

* cited by examiner

HIGH DIELECTRIC CONSTANT MOSFET DEVICE

TECHNICAL FIELD

The present invention relates to an insulating film used for a semiconductor device and a production method for the insulating film. Furthermore, the present invention relates to a transistor element including the insulating film, a semiconductor device, and a production method therefor.

BACKGROUND ART

In recent years, in order to realize further higher packing densities, higher performances, and lower power consumptions of semiconductor devices, various researches have been carried out on improvements of characteristics of insulating films used for semiconductor devices. Examples of insulating films used for semiconductor devices include gate insulating films of transistors, element isolation films, capacitor insulating films, interlayer insulating films, and passivation films, and researches have been carried out on insulating film materials in accordance with respective places for uses.

With respect to the insulating film, attempts have been made to reduce the film thickness $t_{ox}$ in terms of silicon oxide film, while the leakage current has been maintained. The film thickness $t_{ox}$ in terms of silicon oxide film is defined as $t_{ox}=\epsilon_{SiO}t/\epsilon$ with respect to a thin film having a relative dielectric constant of $\epsilon$ and an actual film thickness of t.

For example, a gate insulating film of a 0.05 μm-gate-length-generation semiconductor transistor is required to have such an insulating property that the gate leakage current density is 1 A/cm² or less at a gate voltage of 1.0 V when the film thickness is 1 nm or less in terms of silicon oxide.

Silicon oxide films have been previously used as gate insulating films of transistors. However, when a voltage of 1 V is applied to a silicon oxide film of 1 nm in thickness, even a direct tunneling current alone exceeds 10 A/cm² and, therefore, the silicon oxide film cannot be used.

Consequently, an attempt has been made to apply a metal oxide having a high dielectric constant to the above-described insulating film. If no deterioration occurs in the mobility of electron in a channel due to the application of the metal oxide to the gate insulating film, a reduction in voltage and low power consumption can be realized with no decrease in speed of the transistor.

Besides the above-described insulating property, the following characteristics are also required of the metal insulating material applied to the gate insulating film.

First, the interface to a silicon substrate (or a silicon substrate covered with any one of an extremely thin silicon oxide film, a silicon nitride film, and a silicon oxynitride film) is thermodynamically stable in order to prevent deterioration of the gate capacity due to a heat treatment in a transistor production process.

Second, no fixed charge is included in the film in order to suppress a threshold shift and a decrease in channel mobility of the transistor.

Third, no impurity diffusion in the film occurs in order to suppress a threshold shift and variations of the transistor.

From the viewpoint of the insulating property and the stability of an interface to a silicon substrate, researches have been carried out on applications of $ZrO_2$, $HfO_2$, silicates of them, lanthanoid oxides, and silicates thereof to insulating films until now. $ZrO_2$, $HfO_2$, and lanthanoid oxides have high dielectric constants of at least 20 and excellent insulating properties, but have the following problems in the use as gate insulating films.

The crystallization temperatures are low, and are 400 to 600 degrees. Consequently, when a transistor is produced, noticeable crystallization of an insulating film occurs due to a heat treatment in the forming process therefor. The flatness of the interface to silicon is thereby deteriorated, and the mobility in a channel is reduced. Furthermore, grain boundaries are randomly generated in the insulating film, and may cause variations in characteristics. If a material of an upper electrode reaches the silicon substrate through grain boundaries of crystals, the mobility in a channel is reduced and variations occur in the threshold shift during production of the transistor and, thereby, the transistor has high possibility of deterioration in the performance.

When crystallization occurs randomly in a surface, etching cannot be uniformly carried out in etching of the gate insulating film. As a result, some portions may not be etched and may remain in a source-drain region. In addition, since zirconium, hafnium, and lanthanoid are metal materials and are not present previously in processes of silicon semiconductor devices, many studies on contamination are necessary for introduction of a silicon semiconductor production line. Consequently, $ZrO_2$, $HfO_2$, and lanthanoid oxides are not used readily as gate insulating films of silicon semiconductor transistors as of now.

Silicates of $ZrO_2$, $HfO_2$, and lanthanoid oxides are most promising gate insulating films because the band gap is large although the dielectric constant is in the order of 10, and a phase separation-crystallization temperature is high and is at least 800 degrees. However, silicates cannot be formed into films by the use of vapor phase atomic layer growth, while the vapor phase atomic layer growth is a most promising film-forming process for gate insulating films from the viewpoint of the uniformity in film thickness and the like.

Many studies on contamination are also necessary for introduction of a production line because $ZrO_2$, $HfO_2$, and lanthanoid oxides are contained. Consequently, silicates of $ZrO_2$, $HfO_2$, and lanthanoid oxides are not readily used as gate insulating films of silicon semiconductor transistors as of now.

Researches have also been carried out on application of aluminum oxide ($Al_2O_3$) to the gate insulating film since the crystallization temperature is high and Al has already been present in the silicon semiconductor process. $Al_2O_3$ has a relatively high relative dielectric constant (about 8 to 10 with respect to amorphous, and about 12 with respect to single crystal) and a high insulating property, and the interface to silicon is thermodynamically stable. $Al_2O_3$ has a crystallization temperature of at least 800 degrees. An element Al has already been commonly used for the silicon semiconductor process. Furthermore, $Al_2O_3$ can be formed into a film by the use of vapor phase growth atomic layer growth, while the atomic layer growth is a most promising film-forming process for a gate insulating film. For the above-described reasons, $Al_2O_3$ has been actively researched as the above-described gate insulating film in recent years.

A prototype of a fine transistor of 0.08 μm in gate length is reported in International Electron Device Meeting Technical Digest 2000 P.223, wherein an aluminum oxide film is used as a gate insulating film, and polycrystalline silicon is used as a gate electrode. However, this includes the following problems.

First, a negative charge is present in the aluminum oxide ($Al_2O_3$) film. A negatively electrified fixed charge is believed to be generated when Al vacancy or interstitial oxygen is present in aluminum oxide. Although it is not clear which is the origin of this negative charge as of now, the mobility of electron in the channel is reduced due to this negative fixed charge when the aluminum oxide ($Al_2O_3$) film is applied to the gate insulating film. In addition, the threshold of the transistor is shifted as well. In this report, the mobility of electron actually becomes one-third of that in the case where a silicon oxide film is used, while this reduction is due to the negative fixed charge in the film. Therefore, no advantage is found with respect to the use of the aluminum oxide film as the gate insulating film.

Second, the aluminum oxide thin film has no resistance to diffusion of boron. Consequently, the threshold of the transistor is shifted when boron-doped polycrystalline silicon is used for the gate electrode as in a previous manner.

According to the description in Appl. Phys. Lett., Vol. 77 (2000), P.2207, when an annealing temperature was controlled at 800 degrees to 850 degrees in a boron-doped polycrystalline silicon electrode/$Al_2O_3$ (8 nm)/n-Si system, $8.8 \times 10^{12}$ B ions/$cm^2$ of boron diffused from the polycrystalline silicon electrode to a silicon substrate through $Al_2O_3$, and the flat band voltage was significantly shifted and was 1.54 V.

Since a heat treatment is carried out at about 1,000° C. in the formation of a transistor, the threshold of the transistor shifts and varies significantly due to diffusion of boron. Consequently, in this report, an extremely thin silicon oxynitride film of 0.5 nm or less in thickness was provided between the $Al_2O_3$ film and Si so as to block the diffusion of boron and, thereby, the flat band voltage difference was able to be controlled at about 90 mV even after the annealing was carried out at 800° C. to 850° C. However, as described above, the mobility of electron in the channel is reduced due to the negative fixed charge when $Al_2O_3$ is applied to the gate insulating film. Furthermore, when a silicon nitride film is used at the interface, the nitrogen concentration becomes large at the interface to silicon and, thereby, the mobility of electron in the channel is reduced due to a positive fixed charge.

In Japanese Unexamined Patent Application Publication No. 7-193147, Al is introduced in a laminated film of $SiO_2$ and $Si_3N_4$, SIALON ($Si_3N_4$—AlN—$Al_2O_3$-based solid solution) is applied to a gate insulating film and, thereby, the attempt is made to improve the insulating property and the dielectric constant. However, the dielectric constant is reduced because large amounts of Si is contained.

As described above, in order that $Al_2O_3$ can be used as the gate insulating film, the fixed charge must be reduced and the impurity diffusion must be reduced in the film while the insulating property and the stability of the interface to silicon are maintained. However, simultaneous realization of them is difficult as of now and, in particular, no solution is known to reduce the fixed charge of $Al_2O_3$.

The present invention was made in consideration of these problems, and overcomes problems in the case where aluminum oxide is used as a gate insulating material of a semiconductor transistor. It is an object of the present invention to provide a structure and a production method for a device including a metal insulating material thin film as a gate insulating film, wherein the thin film satisfies characteristics required of a gate insulating film of a 0.05 μm-gate-length-generation semiconductor transistor, in particular, no fixed charge is included in the film, and the impurity diffusion is reduced in the film.

DISCLOSURE OF INVENTION

A semiconductor device of the present invention has an MIS (metal-insulating film-semiconductor) structure, wherein the semiconductor is a film mainly containing silicon or is silicon, and the insulating film is a film mainly containing Al, O, and N atoms. Another semiconductor device of the present invention has an MIS (metal-insulating film-semiconductor) structure, wherein the above-described semiconductor is a film mainly containing silicon or is silicon, and the above-described insulating film is (1-x)$AlO_{3/2}$·xAlN (where 0<x<1).

Another semiconductor device of the present invention has a transistor including a source region, a drain region, a channel region, and a gate electrode provided on the channel region with an insulating film therebetween, wherein the channel region is a film mainly containing silicon or is silicon, and the insulating film is a film mainly containing Al, O, and N atoms. Another semiconductor device has a transistor including a source region, a drain region, a channel region, and a gate electrode provided on the channel region with an insulating film therebetween, wherein the channel region is a film mainly containing silicon or is silicon, and the insulating film is (1-x)$AlO_{3/2}$·xAlN (where 0<x<1).

Furthermore, the insulating film of the semiconductor device of the present invention has a nitrogen concentration ratio of at least 0.1 percent and 10 percent or less in nonmetallic atoms, and the insulating film has a film thickness of 5 nm or less.

A semiconductor device of the present invention has a transistor including a source region, a drain region, a channel region, and a gate electrode provided on the channel region with a first insulating film and a second insulating film therebetween, wherein the first insulating film is a silicon oxide film or a silicon oxynitride film, and the second insulating film is a film mainly containing Al, O, and N atoms. Another semiconductor device has a transistor including a source region, a drain region, a channel region, and a gate electrode provided on the channel region with a first insulating film and a second insulating film therebetween, wherein the first insulating film is a silicon oxide film or a silicon oxynitride film, and the second insulating film is (1-x)$AlO_{3/2}$·xAlN (where 0<x<1). Furthermore, in the semiconductor device of the present invention, the first insulating film is present in the side nearer to the channel region than is the second insulating film, and the gate electrode is polycrystalline silicon, a silicon-germanium mixed crystal, or a metal nitride.

A production method for an insulating film of the present invention includes the step of depositing aluminum and the step of supplying an oxidizing agent and a nitriding agent simultaneously so as to oxidize and nitride and, thereby, an aluminum oxynitride film is formed. Another method includes the step of depositing aluminum and the step of alternately supplying an oxidizing agent and a nitriding agent so as to oxidize and nitride and, thereby, an aluminum oxynitride film is formed. Another production method for an insulating film of the present invention includes the step of depositing aluminum oxide and the step of nitriding the aluminum oxide and, thereby, an aluminum oxynitride film is formed. Furthermore, in the production method for an insulating film of the present invention, the nitrogen concentration ratio is at least 0.1 percent and 10 percent or less in nonmetallic atoms.

A production method for a semiconductor device of the present invention includes the above-described step of forming the insulating film. Another production method for a semiconductor device of the present invention includes the step of forming a gate insulating film by the above-described production method for the insulating film.

The inventors of the present invention found out that when a film mainly containing Al, O, and N atoms was used as an insulating film, an excellent insulating property and an excellent stability of the interface to silicon were exhibited, the dielectric constant was high, the fixed charge was low, and the impurity diffusion was able to be suppressed in the film. In the case where a film mainly containing Al, O, and N atoms was used, for example, in the case where aluminum oxynitride was prepared by addition of nitrogen to aluminum oxide and was used, the negative fixed charge density in the film was reduced significantly. Furthermore, it was verified that the interface between aluminum oxynitride prepared by addition of nitrogen and silicon interface (or a silicon substrate covered with any one of a silicon oxide film, silicon oxynitride film, and the like) was thermodynamically stable, and the diffusion of impurity atoms was suppressed in the film.

With respect to the film mainly containing Al, O, and N atoms, the reason for the reduction of the negative fixed charge density in the film is not clear, but is estimated that nitrogen compensates defects originating the fixed charge. Likewise, the reason for the reduction of the impurity diffusion in the film is not clear, but is estimated that defects originating the fixed charge are reduced by the addition of nitrogen.

Here, the film mainly containing Al, O, and N atoms basically refers to a thin film of a solid solution of alumina (($Al_2O_3$)) and aluminum nitride (AlN), and the chemical composition thereof can be represented by (1-x)$AlO_{3/2}$.xAlN, where (1-x) and x represent a constituent ratio of $Al_2O_3$ and AlN, respectively, in the solid solution, and $0<x<1$ holds. Such an insulating film is hereafter referred to as an aluminum oxynitride film.

In the embodiments, the composition ratio of an aluminum oxynitride insulating film may be represented by the ratio of nitrogen atoms to nonmetallic elements (sum of oxygen and nitrogen) because direct determination can be performed based on the composition analysis with SIMS and the like. The conversion is readily performed between this "nitrogen concentration ratio in nonmetallic elements" and the molar composition ratio x in the above-described expression of the solid solution. The nitrogen concentration ratio in nonmetallic elements can be converted based on a formula $2x/(3-x)$.

The structure of the above-described aluminum oxynitride film may be either a crystal structure or an amorphous structure. However, in consideration of the use as an insulating film in a semiconductor device, the amorphous structure is preferable because no grain boundary is present and the leakage current can be controlled at a low level.

The above-described expression of the solid solution shows an ideal case where alumina and aluminum nitride have respective stoichiometric compositions and are brought into a solid solution. This element constituent ratio may deviate from an ideal state with respect to an actual film, especially, in an amorphous state. However, a deviation is allowable to some extent as long as the leakage current and the fixed charge density are within allowable ranges. Specifically, when the amounts of oxygen and nitrogen relative to Al are fluctuated within the range of −10 percent to +5 percent of the amounts in the stoichiometric compositions, almost no influence is exerted on the characteristics of the insulating film. The present invention includes the case where aluminum oxynitride has a composition deviated to some extent as described above.

Furthermore, atoms other than Al, O, and N may included as additives in the aluminum oxynitride film of the present invention. However, additives other than Al, O, and N may have an influence on the crystallization temperature, the dielectric constant, and the insulating property of the film. Preferably, the crystallization temperature is not reduced, the dielectric constant is not reduced, and characteristics, e.g., the insulating property, are not deteriorated. Specifically, Zr, Hf, or a lanthanoid metal can be added to the aluminum oxynitride film used in the present invention. Preferably, these metals are added in the forms of insulating oxides, e.g., $ZrO_2$ and $HfO_2$, and form solid solutions with aluminum oxynitride serving as a matrix. At this time, deterioration of characteristics can be almost neglected when the amount of a metal oxide to be added is controlled at 20 percent or less of the entirety, preferably at 10 percent or less.

That is, when a metal oxide to be added is represented by MO, and a molar ratio of an additive is represented by y, desirably, $y \leq 0.2$ is satisfied in the compositional formula

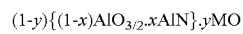

and preferably, $y \leq 0.1$ is satisfied.

An insulating material, e.g., an insulating metal nitride, can be added besides the metal oxide.

The aluminum oxynitride film may be used as any insulating films applicable to semiconductor devices. Here, the use as a gate insulating film is mainly exemplified. However, the aluminum oxynitride film has a high dielectric constant and, therefore, may be used as a capacitance insulating film of DRAM, for example. A film mainly containing silicon can be used as a semiconductor having the MIS structure.

The film mainly containing silicon may be a film including, germanium, carbon, and the like besides silicon. For example, when germanium and carbon are added, desirably, germanium constitutes about 20 percent of the entirety or 10 percent or less, carbon constitutes about 1 percent or less of the entirety. For example, when the compositional formula is represented by Si(1-x'-y').Gex'.Cy', desirably, x' and y' satisfy $0 \leq x \leq 0.2$ and $0 \leq y \leq 0.01$, respectively. In this manner, not only a silicon single crystal, a germanium or other group IV semiconductor, and a silicon substrate, but also even SOI can be used as the semiconductor.

The thickness of the substrate and the film thickness of the semiconductor may be any thickness as long as the thicknesses are effective in forming a transistor. By using the insulating film of the present invention, the fixed charge density can be reduced compared with that in alumina. This is also stable when used as a gate insulating film of a transistor because deterioration does not occur.

Desirably, the above-described insulating film has a nitrogen concentration ratio of at least 0.1 percent and 10 percent or less. Here, the nitrogen concentration ratio indicates the proportion of nitrogen atoms when nonmetallic atoms (the total amount mainly of nitrogen atoms and oxygen atoms) in an aluminum oxynitride film is assumed to be 1. When the nitrogen concentration ratio is 0.1 to 10 percent, the flat band shift is reduced, the diffusion of impurities is suppressed, and the fixed charge density is reduced.

The dielectric constant and the band gap of aluminum nitride (relative dielectric constant: 6.2, band gap: 6.2 eV) are smaller than those of aluminum oxide (relative dielectric constant (amorphous): about 8 to 10, band gap: 8.3 eV). However, when the nitrogen concentration ratio is 0.1 to 10 percent, the insulating property is hardly deteriorated, and the impurity diffusion is suppressed.

When the nitrogen concentration ratio becomes 0.1 percent, the fixed charge density is sharply decreased compared with that in alumina, and as the nitrogen concentration ratio approaches 3.5 percent, the tendency to decrease becomes saturated and the fixed charge density approaches a substantially minimum value. Therefore, desirably, the nitrogen concentration ratio is controlled at 0.1 percent or more, and preferably at 3.5 percent or more. If the nitrogen concentration ratio exceeds 10 percent, the leakage current density is sharply increased, the dielectric constant is sharply decreased, and the crystallization temperature is sharply decreased. Desirably, the nitrogen concentration ratio is controlled at 10 percent or less from the above-described reasons.

Furthermore, when an upper electrode is impurity-containing polycrystalline silicon, preferably, the nitrogen concentration ratio is 5 percent or less since the difference is further decreased between the flat band voltage before a heat treatment and the flat band voltage after the heat treatment. When this is converted to x in the expression $(1-x)AlO_{3/2} \cdot xAlN$, the nitrogen concentration ratio of 0.1 to 10 percent corresponds x of about $1.50 \times 10^{-3}$ to $1.43 \times 10^{-1}$ (0.15 percent to 14.3 percent).

The crystallization temperature is decreased with increase in the nitrogen concentration. However, when the nitrogen concentration ratio is 5 percent or less, the crystallization temperature is maintained at 800 degrees or more. Furthermore, even in the case where crystallization occurs, grain boundaries do not develop adequately, and the surface flatness is not deteriorated.

Desirably, the insulating film has a film thickness of 5 nm or less. This is because in the case where nitrogen plasma is used and the nitrogen plasma can compensate defects effectively, active species in the nitrogen plasma are rapidly deactivated in the neighborhood of the depth exceeding 5 nm and, therefore, nitrogen does not enter the region located at a depth exceeding 5 nm.

The insulating film may be a laminated film of at least two types, and in this case, an aluminum oxynitride film is essentially included as any one of the layers. A silicon oxide film or a silicon oxynitride film may be included as a layer other than the aluminum oxynitride film. Preferably, the insulating film is a laminated film of two types, and includes a first insulating film and a second insulating film. Preferably, the second insulating film is an aluminum oxynitride film, and the first insulating film is a silicon oxide film or a silicon oxynitride film.

When the insulating film is used as a gate insulating film, desirably, the first insulating film, the second insulating film, and the gate electrode are disposed in that order from the channel region side. In this case, desirably, the thickness of the first insulating film is extremely small and is in the order of 0.5 nm. This is because an extremely small thickness prevents the reduction of an effective relative dielectric constant of the aluminum oxynitride film, the interface state density at the interface to silicon is reduced and, thereby, the reduction of mobility of electrons in the channel is suppressed, so that further speedup of the transistor can be realized.

Here, a fresh Si-containing layer may be formed at the interface between the first insulating film and the second insulating film through a heat treatment at a high temperature and the like. However, the content of Si is such a small amount that a reduction of the dielectric constant due to Si can be neglected and, therefore, even when such a layer is formed, a high dielectric constant can be maintained because a layer simply composed of Al, O, and N is present in at least a part of the insulating film of the present invention.

In the case where aluminum oxynitride is used as a gate insulating film of a silicon semiconductor transistor, when polycrystalline silicon or a silicon-germanium mixed crystal is used as the gate electrode, a silicon semiconductor transistor can be realized, wherein aluminum oxynitride has high resistance to impurity diffusion and, thereby, almost no threshold shift nor reduction of mobility occurs due to diffusion of doping elements, e.g., boron.

When aluminum oxynitride is used as a gate insulating film of a silicon semiconductor transistor, and a metal nitride is used as a gate electrode, the work function of the metal nitride film does not vary during the production process for the transistor after the gate electrode is formed. This is because defects are compensated in aluminum oxynitride and, therefore, no path is present for nitrogen to come out of the metal nitride, so that the amount of nitrogen is kept constant in a portion of the metal nitride while the portion is in contact with aluminum oxynitride. Consequently, the flexibility is increased in the production process for the transistor after the gate electrode is formed, and the productivity is increased.

Furthermore, when this insulating film is used as a gate insulating film of a transistor, any known material can be used as a side wall used for the side wall of the gate electrode, and a silicon oxide film, silicon oxynitride film, and the like can be used.

Aluminum oxynitride is formed by reactive sputtering and, thereby, amorphous aluminum oxynitride can be efficiently deposited on a silicon surface. Any previously known methods may be used as the reactive sputtering method. Any apparatus, e.g., various plasma generation apparatuses of parallel-plate type, narrow-gap type, magnetron type, and triode type, can be used as the reactive sputtering apparatus.

Aluminum, aluminum oxide, aluminum nitride, aluminum oxynitride, and the like can be used as a target of the reactive sputtering in the formation of the insulating film of the present invention. However, any material can be used as long as the material can efficiently introduce Al, oxygen, and nitrogen. The nitrogen concentration ratio in aluminum oxynitride can readily be controlled by varying the mixing ratio of a mixed gas of oxygen and nitrogen supplied into a chamber.

When aluminum is used as the target, at least nitrogen and oxygen are introduced into the chamber, and if necessary, other various supply gases, such as rare gases, e.g., Ar, may be introduced in order to generate and maintain plasma or to increase a sputtering efficiency.

When aluminum oxide is used as the target, at least a nitrogen gas is introduced, and if necessary, a rare gas and oxygen can be supplied. When aluminum nitride is used as the target, at least oxygen is introduced as a supply gas, and if necessary, a rare gas and nitrogen can be supplied. When aluminum oxynitride is used as the target, at least a rare gas is introduced as a supply gas, and if necessary, a mixed gas of nitrogen and oxygen can be supplied. In this case, an amorphous aluminum oxynitride film can be formed at a substrate temperature (400° C. or less) commonly used in reactive sputtering.

Since aluminum oxynitride formed here is added as a constituent element of aluminum oxynitride, an elimination step after the formation is unnecessary in contrast to the case where aluminum oxynitride is prepared by nitriding aluminum oxide.

Oxygen vacancies included in the film can be effectively compensated by heat-treating the aluminum oxynitride film formed. Here, the heat treatment refers to annealing of aluminum oxynitride formed on a silicon surface in an atmosphere containing oxygen.

Alternatively, an aluminum oxynitride film can be formed on a silicon surface by an atomic layer deposition method (ALD method), and the resulting aluminum oxynitride film has a nitrogen concentration ratio of at least 0.1 percent and 10 percent or less in nonmetallic atoms. In the ALD method, the step of supplying an aluminum raw material on a silicon surface, followed by adsorbing aluminum, and the step of supplying an oxidizing agent and a nitriding agent while the mixing ratio is adjusted, followed by carrying out oxidation and nitriding, are repeated simultaneously or alternately.

According to this ALD method, adsorption of a raw material precursor on a wafer surface and an oxidation reaction are repeated alternately and, thereby, excellent homogeneity in the wafer can be maintained, while the homogeneity is required of a gate insulating film. Any material is used as a raw metal material in the adsorption of aluminum as long as aluminum can be adsorbed effectively, and an Al-containing organic metal, e.g., trimethylaluminum, may be included.

Likewise, oxidizing agents and nitriding agents may include any material as long as the material can adequately carry out oxidation and nitriding. For example, $H_2O$ or oxygen can be used as the oxidizing agent, and ammonia can be used as the nitriding agent. With respect to the oxynitriding reaction, for example, a mixture of $H_2O$ serving as the oxidizing agent and ammonia serving as the nitriding agent may be used, oxygen plasma may be used as the oxidizing agent, and hydrazine or nitrogen plasma may be used as the nitriding agent.

After trimethylaluminum is applied, water or oxygen plasma may be applied so as to carry out one layer atomic deposition of aluminum oxide. Subsequently, nitrogen plasma may be applied so that nitrogen is included in the film. In a manner similar to that in the reactive sputtering, the resulting aluminum oxynitride may be heated.

Alternatively, an aluminum oxynitride film may be formed by the step of forming aluminum oxide on a silicon surface and, thereafter, nitriding the aluminum oxide. Any method, e.g., reactive sputtering or an ALD method, may be used for forming aluminum oxide as long as the method can form aluminum oxide. With respect to nitriding methods, various nitriding means are applicable, wherein nitrogen plasma, that is, a mixture of nitrogen ions and nitrogen radicals, ammonia, hydrazine, or the like is used.

In particular, when nitrogen plasma is used as the nitriding method, nitrogen active species do not reach a silicon substrate due to high reactivity of the plasma. Consequently, the formation of the fixed charge due to nitriding of the silicon substrate can be prevented, and the fixed charge in the aluminum oxide film can be compensated. According to this method, a transistor can be formed, wherein no threshold shift occurs, the voltage is low, and the power consumption is low.

When the nitriding is carried out by the use of nitrogen plasma, the nitrogen concentration ratio in the film can be controlled by varying the pressure. The nitrogen concentration ratio increases as the plasma generation pressure is reduced. This is because as the plasma generation pressure is reduced, the activation efficiencies of nitrogen radicals and the like in the plasma are increased because of an increase in mean free path and an increase in plasma electron temperature. Through the use of this, for example, the pressure is varied from $10^{-}Pa$ to 1 Pa and, thereby, the nitrogen concentration ratio in the aluminum oxynitride film can readily be controlled at within the range of 1 to 10 percent, so that the fixed charge can be reduced and the impurity diffusion can be suppressed effectively.

It was made clear that the nitrogen concentration ratio in the aluminum oxynitride film was able to be controlled at within a preferable range by a heat treatment after the nitriding step as well. The reason for this is believed that nitrogen is readily eliminated from the aluminum oxynitride film by the heat treatment. Desirably, the temperature of the heat treatment is 600° C. or less in order to prevent oxidation of Si, while the oxidation temperature of Si is 600° C. By carrying out this heat treatment, an aluminum oxynitride film can be formed to have a nitrogen concentration ratio of at least 0.1 percent and 10 percent or less in nonmetallic atoms. When nitrogen is removed by the heat treatment, as described above, no silicon nitride film is generated at the interface between silicon and the gate insulating film due to the heat treatment in the transistor formation process after deposition of the gate insulating film. Therefore, the formation of the fixed charge due to nitriding of the silicon substrate can be prevented, so that a high-speed transistor can be formed wherein no threshold shift occurs.

Japanese Unexamined Patent Application Publication No. 64-23571 discloses a structure in which an oxide layer covers a surface or a side surface of an aluminum nitride film formed on a group III to V compound semiconductor. The oxide layer is provided as a protective layer to prevent penetration of water from the upper side or the side surface of the gate insulating film because aluminum nitride formed on the group III to V compound semiconductor has hygroscopicity. Therefore, this structure does not realize the insulating property of the gate insulating film, the reduction of fixed charge, nor the stability of interface to silicon mainly targeted by the present invention, and is essentially different from the present invention, while the insulating film is formed on silicon in the present invention.

BEST MODE FOR CARRYING OUT THE INVENTION

First Embodiment

Figure 1:
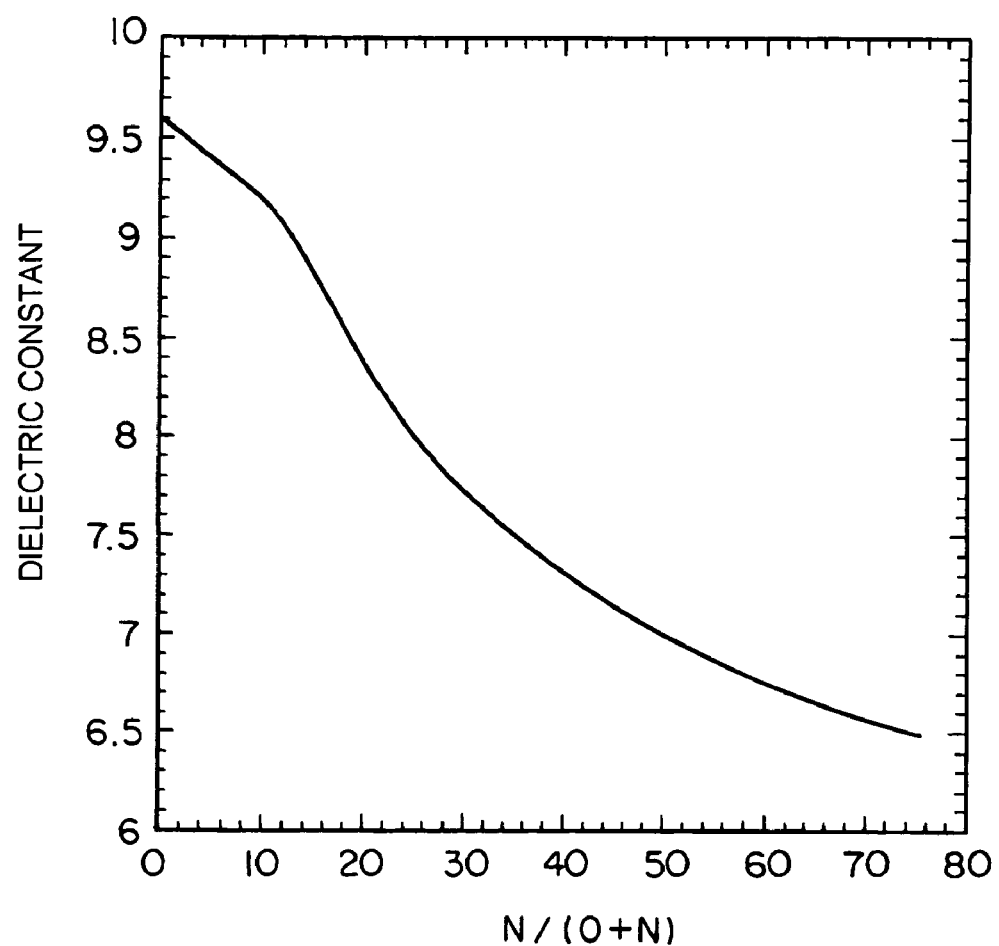
FIG. 1 is a graph showing the composition dependence of the dielectric constant of a metal oxynitride thin film formed on a silicon oxide film, used in an embodiment of the present invention.

In the first embodiment, an aluminum oxynitride film was deposited on a silicon substrate by reactive sputtering. A magnetron sputtering apparatus was used as a reactive sputtering apparatus. An n-type silicon substrate (100) was used as a substrate. Aluminum was used as a target, the distance between the target and the substrate was controlled at about 10 cm, and reactive sputtering was carried out, so as to form an aluminum oxynitride thin film of 5 nm in thickness. The pressure in a chamber was $5 \times 10^{-5}$ Pa when the sputtering was not carried out.

An oxygen-nitrogen mixed gas was supplied during the film formation. Preferably, the total pressure of the mixed gas is controlled at a such level that the mean free path of the gas becomes in the order of a fraction of the distance between the target and the wafer to reduce implantation of sputtered particles into the substrate. The mean free path L (cm) of the gas is represented by L=1.33/P where a pressure is P (Pa). Preferably, the gas pressure is controlled at about 0.5 Pa or more when the distance between the target and the wafer is 10 cm, for example. After the gas pressure was stabilized, a high frequency of 13.56 MHz was applied between the target and a susceptor (including a heater) carrying the substrate with an RF power supply. In the reactive sputtering, heating of the substrate was not carried out, a nitrogen-oxygen mixed gas was supplied, the pressure in the chamber was controlled at 0.6 Pa, and the power of the high frequency of the RF power supply (frequency 13.56 MHz) was 500 W. In order to compensate oxygen vacancies, annealing was carried out at a substrate temperature of 400° C. at 1 atmosphere for 10 minutes in an oxygen atmosphere. After the annealing was carried out, a silicon polycrystal film was formed as an upper electrode on the aluminum oxynitride, boron was implanted into the resulting film, and activation was carried out by a heat treatment (700° C.) in nitrogen.

The fixed charge density of the aluminum oxynitride thin film was determined by calculation from the flat band voltage shift, while the aluminum oxynitride thin film was formed by the reactive sputtering. The fixed charge density was $10^{-8}$ C/cm$^2$ or less, and it was made clear that the fixed charge was reduced compared with the fixed charge in the case where alumina was used. The leakage current density of this film was determined and was $10^{-2}$ A/cm$^2$ or less. This leakage current density was determined during the application of a voltage larger than the flat band voltage by 1 V. The result indicated that the leakage current was reduced in the aluminum oxynitride film. Furthermore, the dielectric constant of this film was determined and was a value in the order of 9.5. Consequently, a high-dielectric constant characteristic was clearly realized compared with the dielectric constant of aluminum oxide.

The crystallization temperature of this film was at least 800° C. and, therefore, a high temperature was achieved with respect to the crystallization temperature. The relationships between the nitrogen concentration ratio and the relative dielectric constant, the fixed charge density, and the leakage current density will be described in detail in a second embodiment.

In the description up to this point, aluminum was used as the target. However, when any one of aluminum oxide, aluminum nitride, and aluminum oxynitride was used as the target, the result was similar to that in the case where aluminum was used as the target.

Second Embodiment

The second embodiment is almost the same as the first embodiment except that a first insulating film is provided between the silicon substrate and the aluminum oxynitride and a laminated film was thereby prepared. The second embodiment is different from the first embodiment in the point that an n-type silicon substrate (100) with 0.5 nm of silicon oxide film (the first insulating film) is used as the substrate.

Aluminum was used as a target, the distance between the target and the substrate was controlled at about 10 cm, and reactive sputtering was carried out, so as to deposit an aluminum oxynitride thin film of 5 nm in thickness. The pressure in a chamber was $5 \times 10^{-5}$ Pa when the sputtering was not carried out. An oxygen-nitrogen mixed gas was supplied during the film formation, the pressure in the chamber was controlled at 0.6 Pa, and the power of the high frequency of the RF power supply (frequency 13.56 MHz) was 500 W. In order to compensate oxygen vacancies, annealing was carried out at a substrate temperature of 400° C. at 1 atmosphere for 10 minutes in an oxygen atmosphere. After the annealing was carried out, a silicon polycrystal film was formed as an upper electrode on the aluminum oxynitride, boron was implanted into the resulting film, and activation was carried out by a heat treatment (700° C.) in nitrogen.

With respect to the aluminum oxynitride thin film formed by the reactive sputtering, the composition dependence of each of the amount of fixed charge, the impurity diffusion, the crystallization temperature, the leakage current, and the relative dielectric constant was examined. Here, the thickness of the aluminum oxynitride was controlled at a substantially constant and was 5 nm. The films were formed to have a constant film thickness in consideration of difference in film formation time depending on the compositional ratio.

FIG. 1 shows the composition dependence of the relative dielectric constant in the case where the activation annealing temperature is 700° C. With respect to the relative dielectric constant, the capacitance of the entire laminated film was measured, and the relative dielectric constant of the aluminum oxynitride was determined from the measurement value, while the laminated film was formed on the silicon substrate and was composed of a silicon oxide film serving as the first insulating film and an aluminum oxynitride film serving as the second insulating film.

As is clear from FIG. 1, the dielectric constant is decreased sharply when the nitrogen concentration ratio exceeds 10 percent on the condition that the film thickness is constant. In FIG. 1, no data is shown in the region where the nitrogen concentration ratio exceeds 75 percent because this region is not suitable for the object of the present invention on the grounds that, for example, the insulating property is significantly inferior to that of aluminum oxide in this nitrogen concentration region and the crystallization temperature is significantly decreased.

Figure 2A:
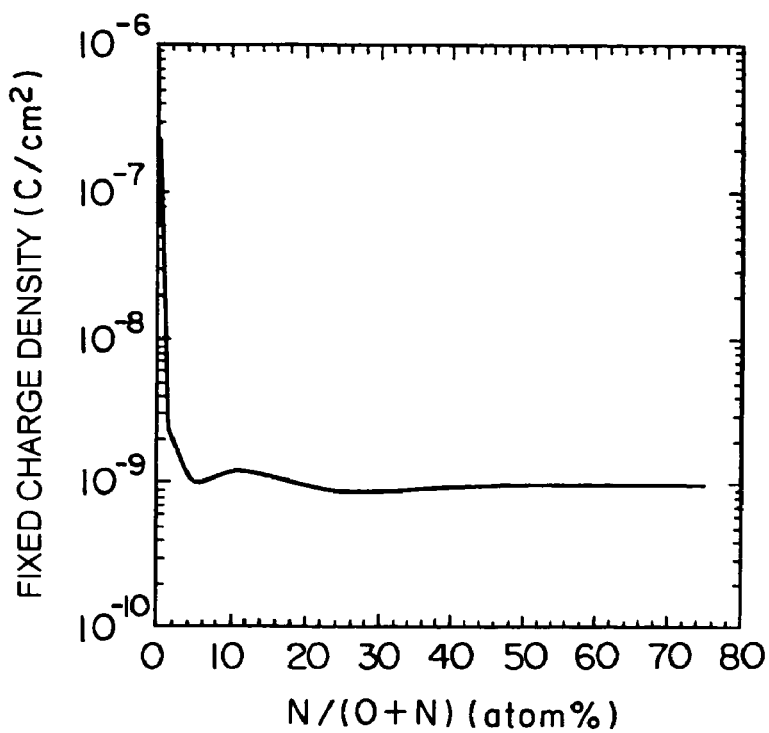
FIGS. 2A and 2B are graphs each showing the composition dependence of the fixed charge in a metal oxynitride thin film formed on a silicon oxide film, used in an embodiment of the present invention.
Figure 2B:
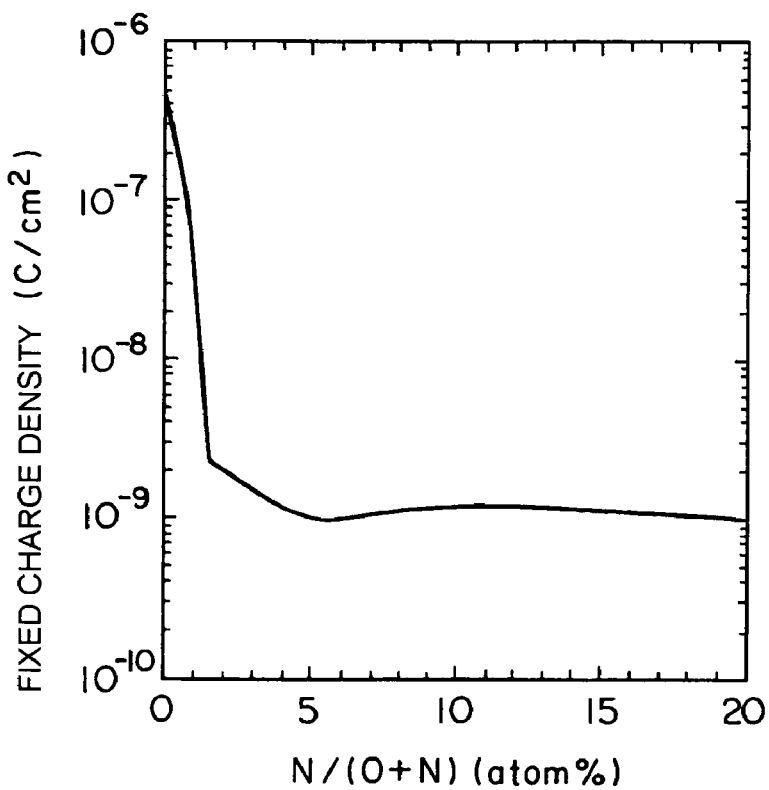

FIG. 2A shows the composition dependence of the fixed charge density in the aluminum oxynitride thin film, while the fixed charge density is calculated from the flat band voltage shift. FIG. 2B is a magnified diagram of a part of FIG. 2A. As is clear from FIGS. 2A and 2B, the fixed charge density is decreased as a result of adding nitrogen to aluminum oxide. As is clear from FIG. 2B, the fixed charge is decreased sharply compared with that in alumina when the nitrogen concentration ratio reaches 0.1 percent and, furthermore, the fixed charge density is decreased to less than or equal to about one-tenth of that in alumina when the nitrogen concentration ratio reaches 1 percent. In addition, the fixed charge density approaches a minimum value when the nitrogen concentration ratio reaches 3.5 percent, and takes on the minimum value when the nitrogen concentration ratio is in the neighborhood of 5 percent. Thereafter, even when the nitrogen concentration ratio is kept on increasing, the fixed charge density is not decreased. When a reduced film thickness is discussed based on the composition dependence of the relative dielectric constant shown in FIG. 1, the reduced film thickness is increased as the nitrogen concentration ratio is increased. Consequently, when the reduced film thickness is required to be controlled at a constant value, the actual film thickness is decreased, and the fixed charge density is predicted to be decreased accompanying that. However, the amount of change of the relative dielectric constant due to the composition is orders of magnitude smaller than the amount of change of the fixed charge density shown in FIGS. 2A and 2B. Therefore, even when the reduced film thickness is controlled at a constant value under predetermined conditions, the fixed charge can be decreased adequately as long as the nitrogen concentration ratio is 0.1 to 10 percent.

Figure 3:
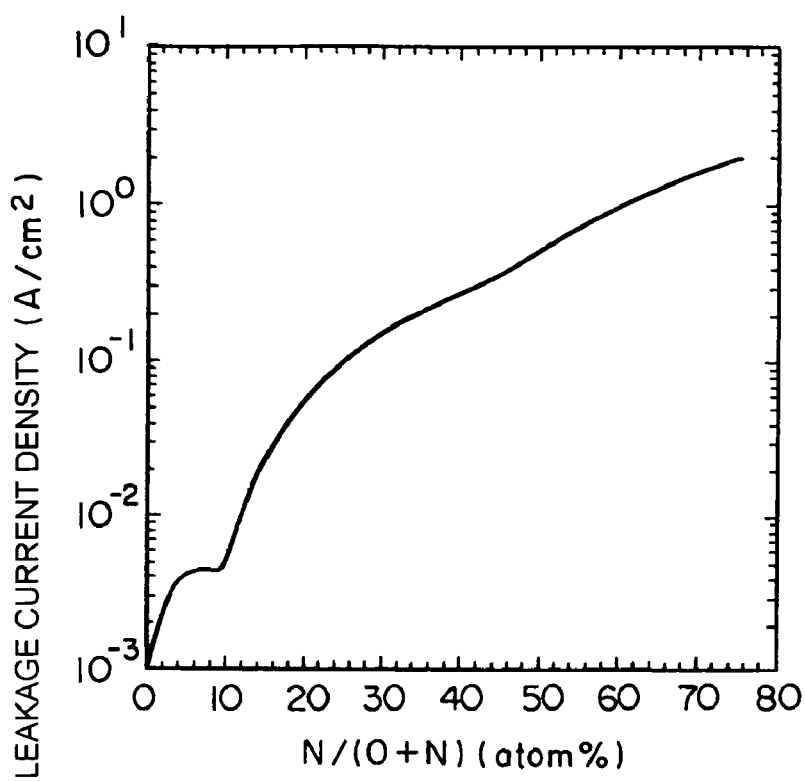
FIG. 3 is a graph showing the composition dependence of the leakage current of a metal oxynitride thin film formed on a silicon oxide film, used in an embodiment of the present invention.

FIG. 3 shows the composition dependence of the leakage current. The leakage current density was determined during the application of a voltage larger than the flat band voltage by 1 V. It is clear that the leakage current density is increased sharply when the nitrogen concentration ratio becomes at least 10 percent. With respect to this as well, in consideration of the fact that the actual film thickness is decreased as the nitrogen concentration ratio is increased when the reduced film thickness is required to be controlled at a constant value, the leakage current density is believed to be increased sharply with the slope larger than the slope of the solid line. However, in a manner similar to that described above, the amount of change of the relative dielectric constant is orders of magnitude smaller than the amount of change of the leakage current density shown in FIG. 3. Therefore, even when the reduced film thickness is controlled at a constant value under predetermined conditions, the leakage current can be decreased when the nitrogen concentration ratio is controlled at 0 to 10 percent.

In FIGS. 2A and 3, no data is shown in the regions where the nitrogen concentrations exceed 75 percent. This regions are not suitable for the object of the present invention on the grounds that, for example, the insulating property is significantly inferior to that of aluminum oxide in this nitrogen concentration region and the crystallization temperature is significantly decreased.

Figure 4:
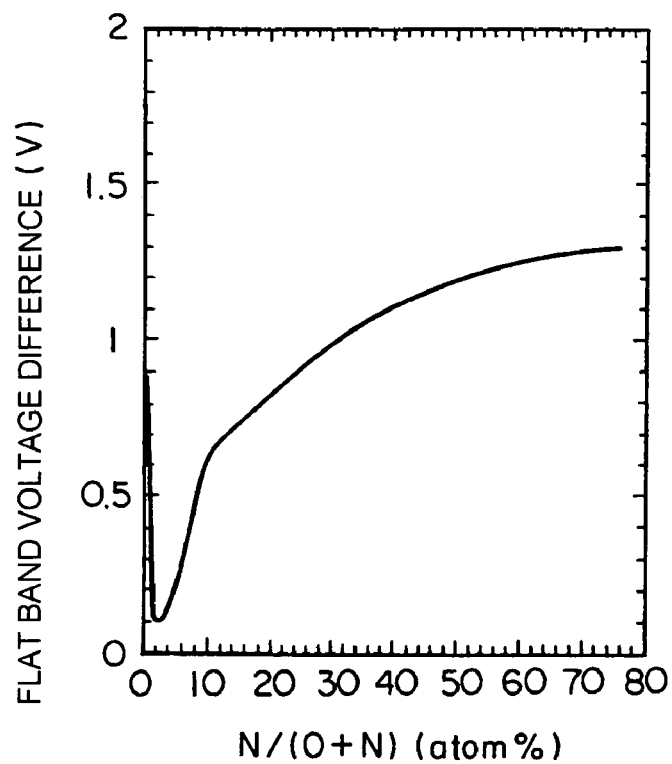
FIG. 4 is a graph showing the composition dependence of the change in flat band voltage, used in an embodiment of the present invention, wherein boron passes through a metal oxynitride thin film during a heat treatment and, thereby, the change is effected.

FIG. 4 shows the composition dependence of the difference between the flat band voltage at an activation annealing temperature of 700° C. and that at 800° C. As is clear from FIG. 4, substantially no flat band difference is recognized as a result of adding 5 percent or less of nitrogen to aluminum oxide. The flat band voltage difference is 0.6 V or less when the nitrogen concentration ratio is within the range of 0.1 to 10 percent, and furthermore, the flat band voltage difference is 0.3 V or less when the nitrogen concentration ratio is within the range of 1 to 5 percent. Consequently, it is clear that the diffusion of impurities is suppressed. The effect of suppressing the diffusion of boron is reduced when the nitrogen concentration ratio exceeds 5 percent. The reason is believed that grain boundaries bonding the upper electrode and the silicon substrate are formed due to noticeable crystallization of the aluminum oxynitride thin film in the above-described nitrogen concentration region, and boron diffuses into the silicon substrate through the grain boundaries, as described below. With respect to this as well, the shape of the graph may be changed to some extent when the reduced film thickness is controlled at predetermined conditions. However, the amount of change in the relative dielectric constant is small and, therefore, no influence is exerted. In FIG. 4 as well, no data is shown in the region where the nitrogen concentration ratio exceeds 75 percent. The reason is the same as that described above. This region is not suitable for the object of the present invention on the grounds that, for example, the insulating property is significantly inferior to that of aluminum oxide in this nitrogen concentration region and the crystallization temperature is significantly decreased.

Figure 5:
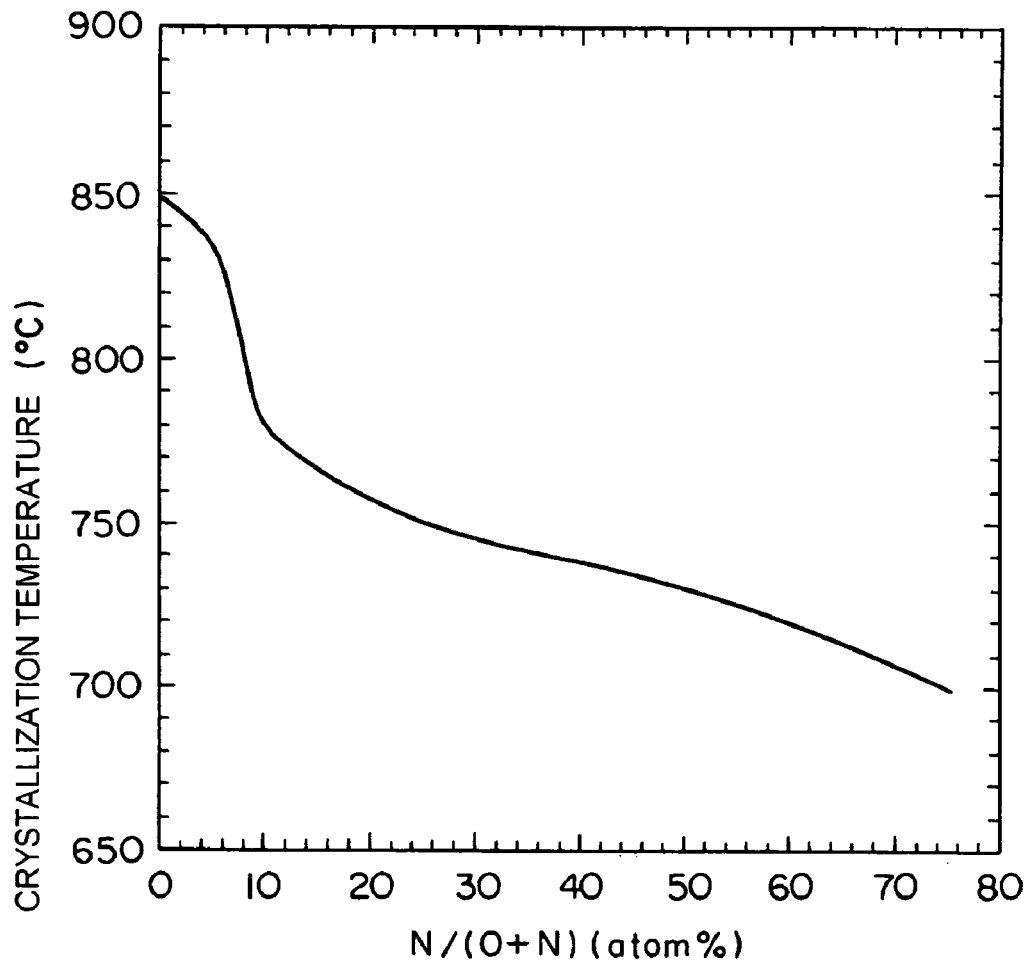
FIG. 5 is a graph showing the composition dependence of the crystallization temperature of a metal oxynitride thin film formed on a silicon oxide film, used in an embodiment of the present invention.

The composition dependence of the crystallization temperature of the aluminum oxynitride prepared was determined by rapidly heating the aluminum oxynitride for 1 minute in nitrogen and carrying out an X-ray diffraction measurement. The results thereof are shown in FIG. 5. The X-ray used was CuKα (wavelength: 0.15418 nm). The film thickness of the aluminum oxynitride film used for the measurement was 25 nm. As is clear from FIG. 5, the crystallization temperature becomes 800° C. or less when the nitrogen concentration exceeds 10 percent in nonmetallic atoms and, therefore, phase separation of aluminum oxynitride occurs by heating to at least 800° C. while aluminum oxynitride is crystallized. Consequently, in the case where the nitrogen concentration exceeds 10 percent in nonmetallic atoms, occurrence of the above-described impurity diffusion is estimated.

In the case where the laminated layer included the first insulating film and the second insulating film, even when a silicon oxynitride film or other insulating film was used as the first insulating film in place of the silicon oxide film, as in the present embodiment, thermodynamic stability of the interface to silicon was verified through the use of a TEM observation. Therefore, it was made clear that the interface state density was reduced at the interface to silicon when the first insulating film was provided at the interface between silicon and aluminum oxynitride so as to prepare a laminated film.

In the description up to this point, aluminum was used as the target. However, when any one of aluminum oxide, aluminum nitride, and aluminum oxynitride was used as the target, the result was similar to that in the case where aluminum was used as the target.

Third Embodiment

Figure 6:
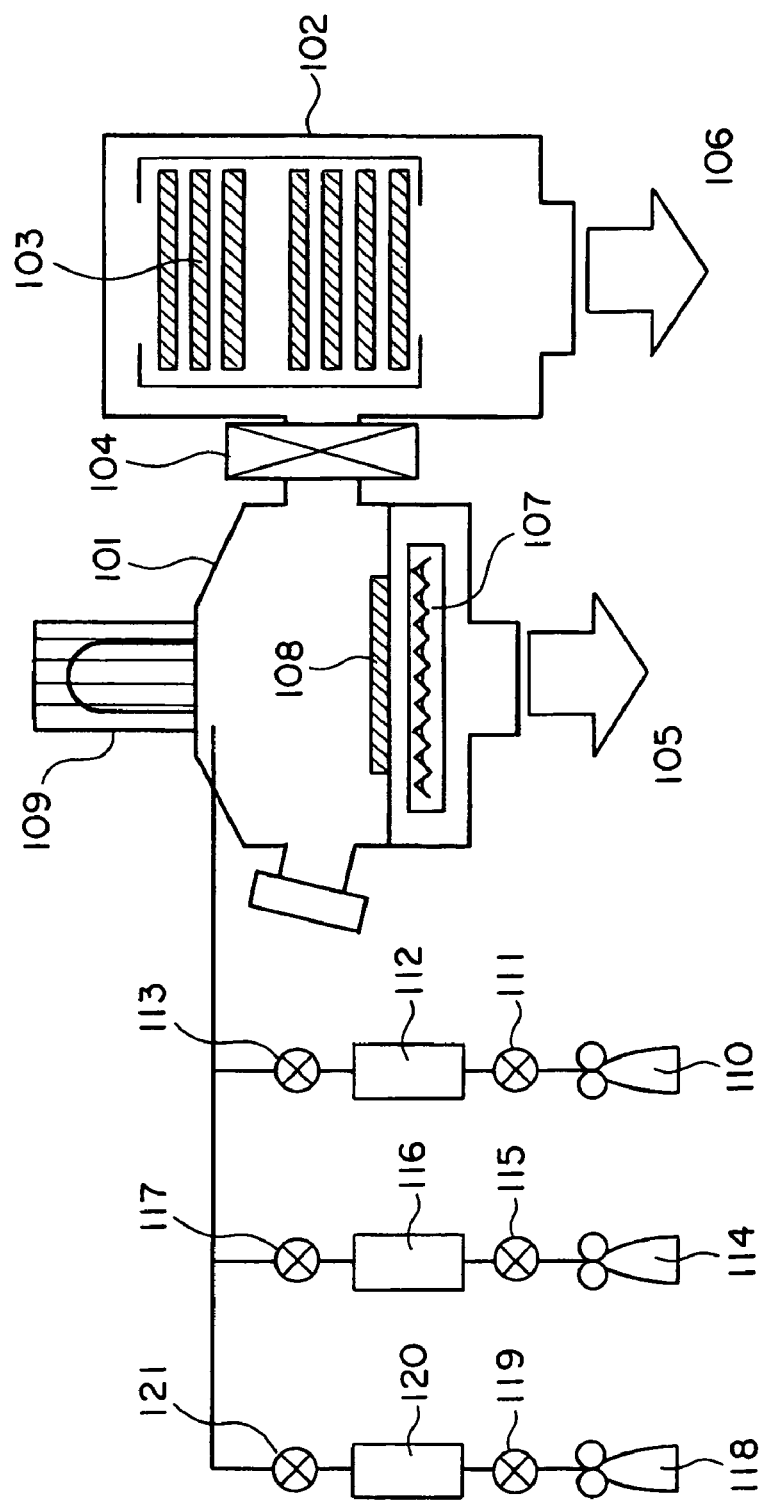
FIG. 6 is a system diagram of an atomic layer deposition apparatus used in the present invention.

In the third embodiment, aluminum oxynitride was formed by an atomic layer deposition method (ALD method). FIG. 6 shows a conceptual diagram of an atomic layer deposition apparatus with a plasma source, used in the present embodiment. The present apparatus is composed of a sample treatment chamber 101 and an exchange chamber 102, and a plurality of wafers 103 can be contained in the exchange chamber 102. A gate valve 104 is provided between the sample treatment chamber 101 and the exchange chamber 102, and gases are exhausted from the chambers with exhaust systems 105 and 106, respectively, composed of a plurality of pumps.

A heater 107 is disposed immediately below a wafer 108 carried from the exchange chamber to the sample treatment chamber, and heats the wafer to a predetermined temperature. An ECR plasma source 109 is disposed above the wafer 108 in the upper portion of the chamber, and serves as a plasma source.

In order to form a metal oxynitride on the upper surface of the wafer, a metal material gas, an oxidizing agent, and a nitriding agent is introduced with gas supply systems 110 to 121.

The gas supply systems 110 to 121 are composed of metal material gas supply systems 110 to 113, oxidizing agent supply systems 114 to 117, and nitriding agent supply systems 118 to 121. Each of the gas supply systems has basically the same configuration, and is composed of a raw material cylinder 110, 114, or 118, stop valves 111 and 113, 115 and 117, or 119 and 121, and a mass flow controller 112, 116, or 120. The raw material cylinder 110 contains a metal material gas of trimethylaluminum, the raw material cylinder 114 contains the oxidizing agent of water or oxygen, and the raw material cylinder 118 contains the nitriding agent of ammonia, hydrazine, or nitrogen. The raw material cylinder 110 of trimethylaluminum is heated to 45° C. in order that the mass flow controller 112 is normally operated.

A film formation procedure will be described. In the deposition of aluminum oxide by the ALD method, usually, trimethylaluminum and water serving as the oxidizing agent are applied alternately. In the deposition of aluminum oxynitride by the ALD method, ammonia is added to water serving as the oxidizing agent, and an application to the substrate is carried out.

An n-type silicon substrate (100) was used as a substrate. The deposition apparatus was evacuated at a reduced pressure of $10^{-5}$ Pa or less. Trimethylaluminum was applied at a partial pressure of 1 P for 10 seconds at a substrate temperature of 300° C. and, subsequently, a mixed gas of $H_2O$ and ammonia was applied at 1 Pa for 10 seconds. The deposition per cycle was about 0.1 nm, and deposition was repeated 20 times so as to deposit 2 nm of aluminum oxynitride. With respect to the present method, it was verified that the amount of nitrogen in the film was able to be changed by voluntarily changing the mixing ratio of $H_2O$ and ammonia. In the case where the film was formed by the atomic layer deposition method through the above-described procedure, nitrogen was added as a constituent element of aluminum oxynitride.

Thereafter, annealing was carried out at a substrate temperature of 400° C. at 1 atmosphere for 10 minutes in an oxygen atmosphere. After the annealing was carried out, a silicon polycrystal film was formed as an upper electrode on the aluminum oxynitride, boron was implanted into the resulting film, activation was carried out by a heat treatment in nitrogen, and the film characteristics were evaluated. The aluminum oxynitride deposited by the present method was verified to exhibit the properties equivalent to those of the above-described aluminum oxynitride film deposited by the sputtering method when the nitrogen contents were the same.

Fourth Embodiment

In the fourth embodiment, an ALD method as in the third embodiment is used. However, plasma irradiation was carried out in the fourth embodiment in contrast to the third embodiment wherein the mixed gas of $H_2O$ and ammonia was used.

In carrying out the plasma irradiation as well, a silicon substrate as in the third embodiment was used, and the apparatus shown in FIG. 6 was used. The plasma source was attached in the location immediately above a wafer at a distance of 20 cm. After trimethylaluminum was applied at a substrate temperature of 300° C., a mixed gas of $O_2$ and $N_2$ was introduced at a pressure of $10^{-1}$ Pa, plasma was applied with 80 W of power for 15 seconds, and subsequently, each application was repeated alternately, so as to deposit aluminum oxynitride. The deposition per cycle was about 0.1 nm as in the above description, and deposition was repeated 20 times so as to deposit 2 nm of aluminum oxynitride. With respect to the present method, it was verified that the amount of nitrogen in the film was able to be changed by voluntarily changing the mixing ratio of $O_2$ and $N_2$. Thereafter, annealing was carried out at a substrate temperature of 400° C. at 1 atmosphere for 10 minutes in an oxygen atmosphere. After the annealing was carried out, a silicon polycrystal film was formed as an upper electrode on the aluminum oxynitride, boron was implanted into the resulting film, activation was carried out by a heat treatment in nitrogen, and the film characteristics were evaluated.

The aluminum oxynitride deposited by this method was verified to exhibit the properties equivalent to those of the above-described aluminum oxynitride film deposited by the sputtering method when the nitrogen contents were the same. Alternatively, after trimethylaluminum was applied, water or oxygen was applied to deposit usual aluminum oxide. Subsequently, nitrogen plasma was applied in order that nitrogen was contained in the film, and each application was repeated. As a result, it was verified that a comparable film was able to be deposited.

As described above, with respect to the aluminum oxynitride film formed by the ALD method as well, the fixed charge was able to be reduced, the impurity diffusion was able to be suppressed, and a high-dielectric constant characteristic was able to be realized.

Fifth Embodiment

The fifth embodiment is different from the third embodiment in the point that a silicon oxide film serving as the first insulating film is provided between silicon and aluminum oxynitride so as to prepare a laminated film.

An aluminum oxynitride film was deposited by the ALD method. An n-type silicon substrate (100) with 0.5 nm of silicon oxide film (the first insulating film) was used as the substrate. Trimethylaluminum was applied under the condition as in the third embodiment and, subsequently, a mixed gas of water and ammonium was applied. These were repeated alternately, so as to deposit 2 nm of aluminum oxynitride. After annealing was carried out as in the third embodiment, a film of upper electrode was formed, and the film characteristics were evaluated. The aluminum oxynitride deposited by the present method was verified to exhibit the properties equivalent to those of the above-described aluminum oxynitride film deposited by the sputtering method when the nitrogen contents were the same.

It was also verified that since the aluminum oxynitride film was formed as a laminated film in the fifth embodiment, the interface state density was reduced and the reduction in mobility of channel electrons were suppressed compared with those in the third embodiment. Similar results were attained when an insulating film, e.g., a silicon oxynitride film, other than the silicon oxide film was used as the first insulating film between the aluminum oxynitride film and silicon. In the case where plasma irradiation was carried out by the use of mixed plasma generated from a mixed gas of $O_2$ and $N_2$, as in the fourth embodiment, instead of the mixed gas of $H_2O$ and ammonia, a comparable aluminum oxynitride film was able to be prepared.

Sixth Embodiment

With respect to the method carried out in the sixth embodiment, aluminum oxide was deposited to have a predetermined film thickness and, subsequently, nitriding was carried out from the film surface, so as to form an aluminum oxynitride thin film. The aluminum oxide was formed by the ALD method, and a nitriding reaction was carried out with nitrogen plasma (a mixture of nitrogen ions and nitrogen radicals).

An n-type silicon substrate (100) with 0.5 nm of silicon oxide film was used as the substrate, and 2 nm of $Al_2O_3$ was deposited by the ALD method. Subsequently, nitrogen plasma was applied to the $Al_2O_3$ film surface. The substrate was introduced into the above-described apparatus equipped with a small ECR plasma source for a vacuum reaction so as to carry out nitriding. The nitriding was carried out with 80 W of power for 10 minutes at a substrate temperature of 300° C. at a pressure of $10^{-1}$ Pa, and it was verified that nitrogen was contained in the film.

Thereafter, annealing was carried out at a substrate temperature of 400° C. at 1 atmosphere for 10 minutes in an oxygen atmosphere. As a result of the above-described annealing, most of nitrogen contained in the film was eliminated, and only about 1 atomic percent of trace nitrogen was contained regardless of the nitrogen content before annealing. The elimination of nitrogen by the annealing was also observed in the case where ammonia or hydrazine was used for nitriding reaction. Consequently, a maximum amount of nitrogen becomes about 1 atomic percent, while this nitrogen is added to aluminum oxide by after-nitriding and is not readily eliminated.

Subsequently, a silicon polycrystal film was formed as an upper electrode on the aluminum oxynitride, boron was implanted into the resulting film, activation was carried out by a heat treatment in nitrogen, and the film characteristics were evaluated. The film subjected to the above-described nitriding treatment was verified to exhibit the properties equivalent to those of the aluminum oxynitride film deposited by the sputtering method and having a nitrogen content of about 1 percent.

Furthermore, the surface density of nitrogen atoms bonded to the silicon substrate becomes $1 \times 10^{-10}/cm^2$ until the fixed charge in the film was reduced to one-tenth the original value, and it was verified that the surface density was able to be reduced. This is because nitriding activation species do not reach the silicon substrate due to high reactivity of plasma. Consequently, according to this method, a transistor can be formed, wherein no threshold shift occurs, the voltage is low, and the power consumption is low.

The nitrogen plasma was used in the above-described embodiment. However, it was verified that similar effects were able to be exerted even when the nitriding was carried out by the use of ammonia or hydrazine in the nitriding reaction.

Seventh Embodiment

In the seventh embodiment, the change in nitrogen concentration ratio was examined while the pressure was varied with respect to the method for nitriding aluminum oxide. This method was carried out in the sixth embodiment.

A nitrogen profile was examined in the case where 100 nm of aluminum oxide was deposited on a silicon substrate covered with a silicon oxide film and was nitrided with nitrogen plasma while the nitrogen pressure was varied. The condition of the nitriding was similar to that in the third embodiment. As the pressure was decreased, nitrogen was added to deeper portion because of a temperature increase of particles in plasma. However, nitrogen entered by only about 5 nm at a minimum pressure ($10^{-1}$ Pa) required to stably generate the plasma. Consequently, with respect to addition of nitrogen to aluminum oxide, it was made clear that the film thickness of aluminum oxide had to be 5 nm or less in the case where nitrogen plasma was used because of high capability to compensate the fixed charge.

In the above-described embodiment, the silicon substrate covered with the silicon oxide film was used as the substrate. Similar results apply to the case where a silicon substrate or a silicon substrate covered with any one of extremely thin silicon oxynitride films is used.

Eighth Embodiment

Figure 7A:
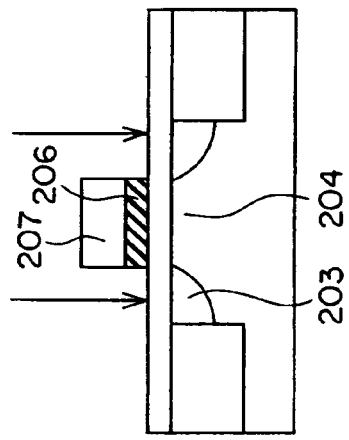
FIGS. 7A to 7D are sectional views showing the structure and the production steps of a semiconductor device used in an embodiment of the present invention.
Figure 7B:
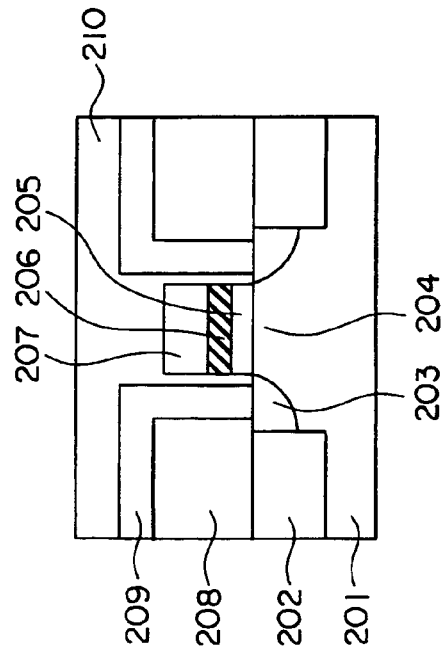
Figure 7C:
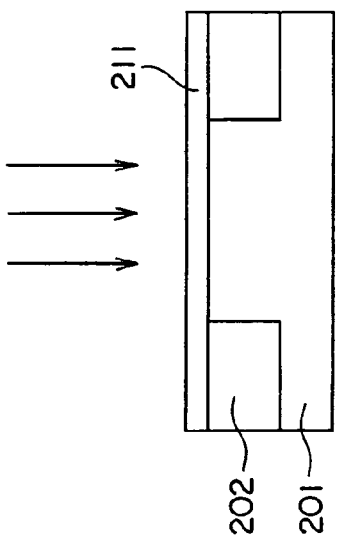
Figure 7D:
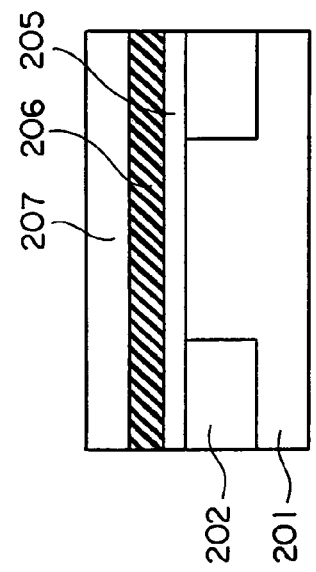

FIG. 7D is a sectional view of an n-type transistor according to the first embodiment.

Element isolation regions 202 having an STI structure are provided on an n-type single crystal silicon substrate 201 having an impurity concentration in the order of $5 \times 10^{15}$ $cm^{-3}$. A p well (not shown in the drawing) is provided in an n-type transistor formation region. In the transistor region isolated by the element isolation regions 202, a p-type channel impurity layer is provided (not shown in the drawing) in order to control the threshold while having an impurity concentration in the order of $5 \times 10^{16}$ $cm^{-3}$ and a source-drain region 203 is provided and is composed of an n-type diffusion layer having an impurity concentration in the order of $5 \times 10^{19}$ $cm^{-3}$. A silicon oxynitride film 205 (film thickness of 0.5 nm in terms of silicon oxide film) is provided on a channel region 204, and aluminum oxynitride (N/(O+N)=5 percent) 206 of 1.2 nm in film thickness is further provided thereon.

A gate electrode 207 composed of polycrystalline silicon and WSi is provided on the aluminum oxynitride film 206 while the gate electrode 207 is self-aligning relative to the source-drain region 203. Each source-drain electrode 209 is provided and is electrically connected to each source-drain region 203 through a contact hole provided in an interlayer insulation film 208. Furthermore, the entirety is covered with a passivation film 210.

A production method for a single n-type transistor according to the first embodiment will be described sequentially with reference to FIGS. 7A to 7D.

The surface of an n-type single crystal silicon substrate 201 is cleaned by a cleaning method through the use of a mixed aqueous solution of hydrogen peroxide, ammonia, and hydrochloric acid. Since the object is to clean the surface of the single crystal silicon substrate 201, cleaning methods other than the above-described method may be used.

A p well is formed on the silicon substrate 201. Grooves are dug on the substrate 201 by an RIE (Reactive Ion Etch)

method, and insulating films are embedded in the grooves, so as to form trench-type element isolation regions 202.

Subsequently, a silicon oxide film 211 of about 5 nm in thickness is formed, and channel ion implantation is carried out so as to form a p-type channel impurity layer (not shown in the drawing). Furthermore, activation of the p-type channel impurity layer is carried out by RTA (Rapid Thermal Anneal) at 800° C. for about 10 seconds (FIG. 7A).

The silicon oxide film is peeled off with hydrofluoric acid, and a silicon oxynitride film 205 (film thickness of 0.5 nm in terms of silicon oxide film) is formed. Thereafter, aluminum oxynitride (N/(O+N)=5 percent) is formed by a reactive sputtering method through the use of an aluminum target without heating the substrate, while the aluminum oxynitride serves as a metal oxynitride insulating film 206 of 1.2 nm in film thickness. During the reactive sputtering, a nitrogen-oxygen mixed gas is supplied, the pressure in a chamber is controlled at 0.6 Pa, and the power of the high frequency of an RF power source (frequency 13.56 MHz) is 500 W. Not only aluminum, but also any one of aluminum oxide, aluminum nitride, and aluminum oxynitride can be used as the target, and an ALD method or nitriding of aluminum oxide may be used in place of the reactive sputtering method.

When the ALD method is used, the ALD method can be carried out as in the formation of aluminum oxynitride carried out in the above-described third, fourth, and fifth embodiments. When the nitriding of aluminum is used, the nitriding of aluminum can be carried out as in the sixth embodiment. Subsequently, annealing is carried out at 1 atmosphere at 400° C. for 10 minutes in an oxygen atmosphere.

Polycrystalline silicon 207 is formed on the metal oxynitride insulating film 206 by a low-pressure chemical vapor deposition method (LPCVD). A photoresist pattern (not shown in the drawing) is formed on the polycrystalline silicon 207 (FIG. 7B). The polycrystalline silicon 207 and the metal oxynitride insulating film 206 are patterned by anisotropic etching through the use of this photoresist pattern as an mask for etching.

The photoresist pattern, the polycrystalline silicon 207, and the metal oxynitride insulating film 206 are used as masks for ion implantation, impurity ions (arsenic) are implanted into the substrate 201 and, thereby, a source-drain region 203 is formed while the source-drain region 203 is self-aligning relative to the polycrystalline silicon 207 and the metal oxynitride insulating film 206 (FIG. 7C).

The photoresist pattern is removed, and a heat treatment (1 atmosphere, 1000° C., 1 second, nitrogen atmosphere) is carried out to activate the source-drain and the polycrystalline silicon 207. An interlayer insulation film 208 is formed. Contact holes are formed to reach the source-drain region 203 and the polycrystalline silicon 207, Co and TiN (not shown in the drawing) are deposited, and an RTA (Rapid Thermal Anneal) treatment is carried out in nitrogen at 700° C. for 10 seconds. Thereafter, this is patterned so as to form a source electrode, a drain electrode 209, and a gate electrode composed of the polycrystalline silicon 207 and WSi (FIG. 7D).

Annealing is carried out at 400° C. for 10 minutes in an atmosphere in which a ratio of nitrogen to hydrogen is 9:1. Finally, a passivation film 210 is formed all over the surface, so as to prepare a transistor shown in FIG. 7D.

With respect to the transistor in the eighth embodiment, the aluminum oxynitride has no fixed charge and has high resistance to impurity diffusion and, therefore, no threshold shift nor deterioration of the mobility in the channel were observed. The gate capacitance per unit area was 3.7 [$\mu$F/cm$^2$], and was larger than the gate capacitance per unit area of 3.6 [$\mu$Frad/cm$^2$] expected when the film thickness of the gate insulating film was 1.0 nm in terms of silicon. That is, the film thickness of the gate insulating film prepared was 1.0 nm or less in terms of silicon.

Figure 8:
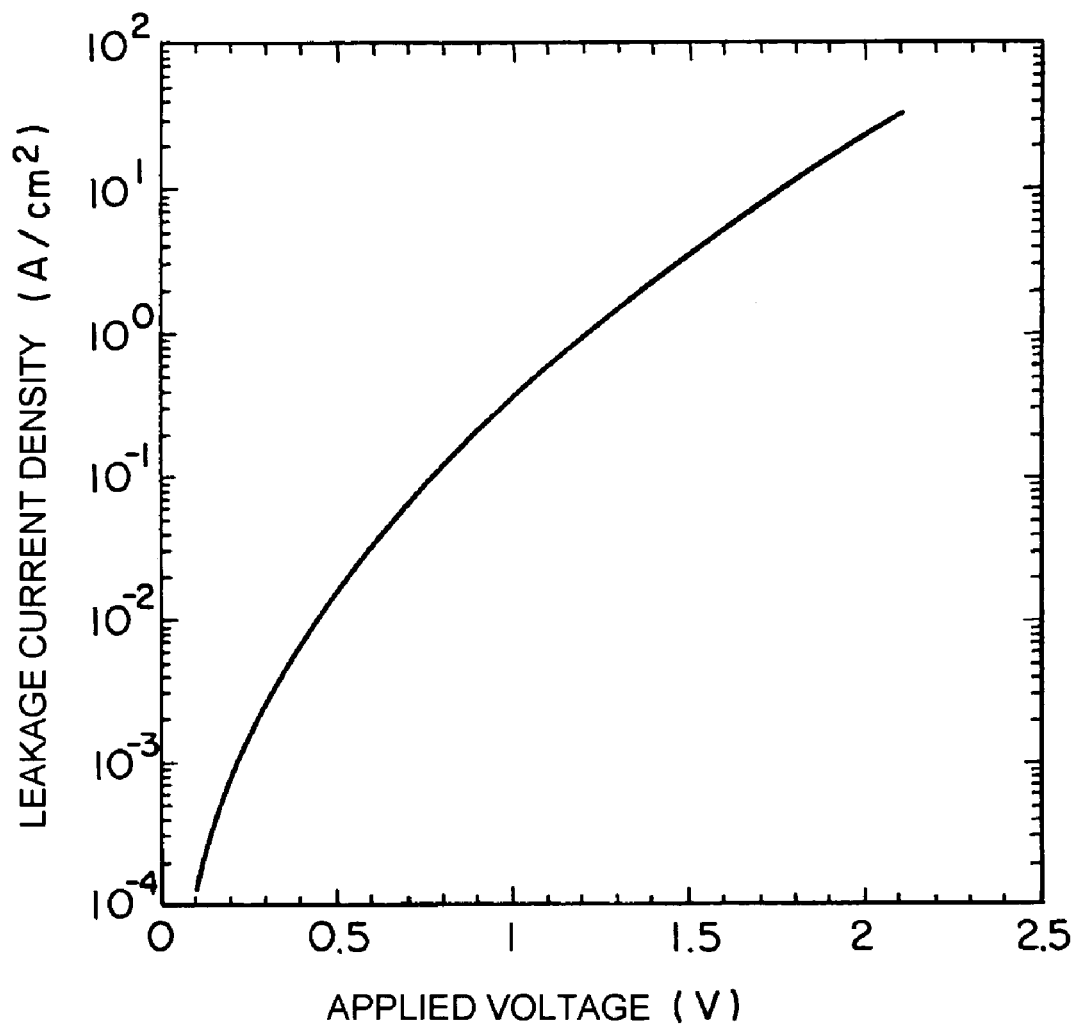
FIG. 8 is a graph showing the gate leakage characteristic of a semiconductor device used in an embodiment of the present invention.

FIG. 8 shows the gate voltage dependence of the gate leakage current density of the transistor prepared in the above-described steps. The gate leakage current density is 1 A/cm2 at a gate voltage of 1.0 V. The interface state density was 5×10$^{10}$/cm$^2$ eV at the interface between the gate insulating film of the transistor prepared in the above-described steps and silicon. This value was substantially the same as the interface state density at the interface between a silicon oxide film formed by usual thermal oxidation and silicon. The operation of the thus prepared transistor was checked, and the transistor exhibited proper operation.

Even when a silicon-germanium mixed crystal was used as the gate electrode in the above-described structure, the resulting effects were similar to those in the case where the polycrystalline silicon was used.

Ninth Embodiment

Figure 9A:
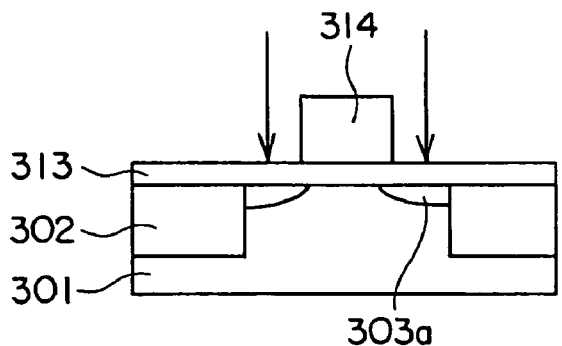
FIGS. 9A to 9E are sectional views showing the structure and the production steps of a semiconductor device used in an embodiment of the present invention.
Figure 9B:
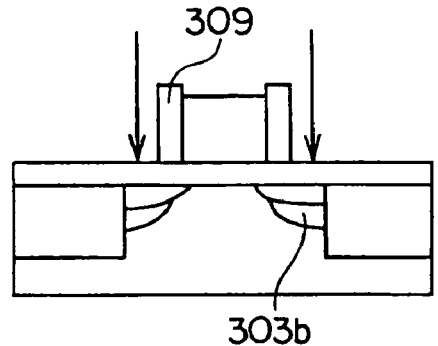
Figure 9C:
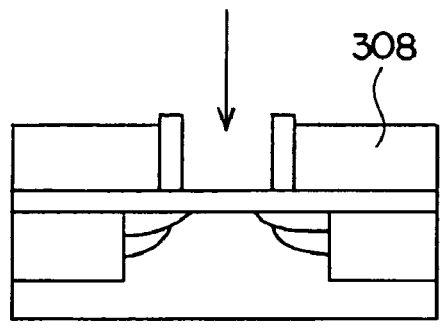
Figure 9D:
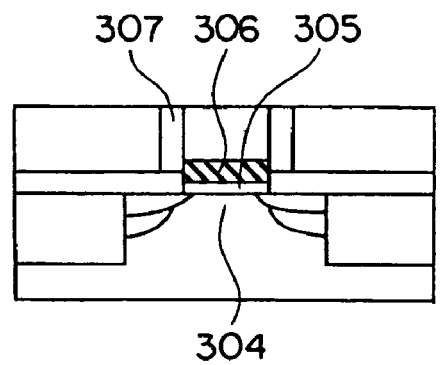
Figure 9E:
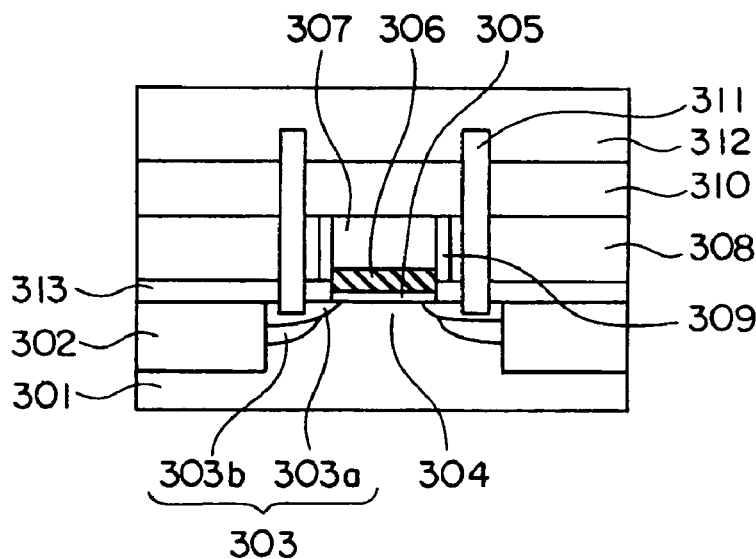

FIG. 9E is a sectional view of a single n-type transistor according to the ninth embodiment. Element separation regions 302 having an STI structure are provided on an n-type single crystal silicon substrate 301 having an impurity concentration in the order of 5×10$^{15}$ cm$^{-3}$.

A p well (not shown in the drawing) is provided in an n-type transistor formation region. In the transistor region isolated by the element isolation regions 302, a source-drain region 303 is provided and is composed of an n-type diffusion layer having an LDD (Lightly Doped Drain) structure with an impurity concentration in the order of 5×10$^{19}$ cm$^{-3}$ (303a) and an impurity concentration in the order of 5×10$^{20}$ cm$^{-3}$ (303b). A p-type channel impurity layer (not shown in the drawing) is provided in only the channel region 304 in order to control the threshold while having an impurity concentration in the order of 5×10$^{16}$ cm$^{-3}$.

A silicon oxide film 305 of 0.5 nm in film thickness is provided on the channel region 304, and aluminum oxynitride (N/(O+N)=1 percent) 306 of 1.2 nm in film thickness is further provided thereon. A gate electrode 307 composed of TiN and W is provided on the aluminum oxynitride film 306 while the gate electrode 307 is self-aligning relative to the source-drain region 303b.

A silicon oxide film 309 is provided between the metal oxynitride insulating film 306 and an interlayer insulating film 308. Each source-drain electrode 311 is provided and is electrically connected to each source-drain region 303 through a contact hole provided in the interlayer insulation films 308 and 310. Furthermore, the entirety is covered with a passivation film 312.

A production method for a single transistor according to the ninth embodiment will be described sequentially with reference to FIGS. 9A to 9D.

The surface of an n-type single crystal silicon substrate 301 is cleaned as in the first embodiment so as to form a p well.

Grooves are dug on the substrate 301 by the RIE method, and insulating films are embedded in the grooves to form trench-type element isolation regions 302. Subsequently, a silicon oxide film 313 of about 5 nm in thickness is formed. A polycrystalline silicon film of about 300 nm in film thickness is deposited all over this silicon oxide film in order to form a dummy gate pattern 314, and is processed into the dummy gate pattern by lithography and the RIE method. The polycrystalline silicon is used for the dummy gate pattern 314 because the etching selectivity is readily adjusted relative to the silicon oxide film 313 during the RIE and, thereby, etching damage to the silicon substrate 301 due to the RIE is readily reduced.

In order to form the LDD structure, about $4\times10^{13}$ cm$^{-2}$ of phosphorous ion implantation is carried out at 70 KeV, so that an n-type diffusion layer 303a is formed (FIG. 9A). After a silicon oxide film is deposited all over the surface, the RIE is carried out all over the surface, so that a silicon oxide film 309 of about 20 nm in thickness is formed on the side surface of a dummy gate pattern 305.

Subsequently, about $5\times10^{15}$ cm$^{-2}$ of arsenic ion implantation is carried out at 30 KeV to form an n$^+$-type diffusion layer 303b and to form the LDD structure (FIG. 9B). About 300 nm of silicon oxide film 308 is deposited all over the surface by CVD, and annealing is carried out in a nitrogen atmosphere at 750° C. for 30 minutes.

RTA is carried out in a nitrogen atmosphere at 950° C. for 10 seconds to activate the ion implantation layer of the source-drain. Flattening is carried out all over the surface by CMP (Chemical Mechanical Polishing) to expose the surface of the polycrystalline silicon film serving as the dummy gate pattern 314.

The exposed dummy gate pattern 314 is selectively removed by the RIE to expose the surface of the silicon oxide film 313. Thereafter, only a desired channel region 304 is subjected to ion implantation through the use of the interlayer insulation film 308 and the side wall insulating film 309 as masks. With respect to the n channel transistor, in order to control the threshold at about 0.7 V, about $5\times10^{12}$ cm$^{-2}$ of boron ion implantation is carried out at 10 KeV, and a p-type channel region is selectively formed only in the channel region (FIG. 9C).

The silicon oxide film 313 is removed with diluted hydrofluoric acid, and a silicon oxide film 305 of 0.5 nm in film thickness is formed on the exposed silicon substrate surface. Aluminum oxide of 1.2 nm in film thickness is deposited all over the surface by the use of the ALD. The aluminum oxide is subjected to after-nitriding with nitrogen plasma, so as to form aluminum oxynitride (N/(O+N)=1 percent) serving as the metal oxynitride insulating film 306.

In the ALD method used for depositing aluminum oxide, trimethylaluminum was used as the raw material, and water or oxygen plasma was used as an oxidizing agent. Trimethylaluminum was applied at a substrate temperature of 300° C. at 1 Pa for 10 seconds, and succeedingly, an oxidizing agent was applied. These applications were repeated alternately and, thereby, a film was formed. When plasma was used, the plasma was applied with 80 W of power for 15 seconds.

Here, the ALD method is used for depositing aluminum oxide. However, reactive sputtering may be used. In the case where nitrogen plasma is used for nitriding aluminum oxide, the nitriding is carried out at a substrate temperature of 300° C. at $10^{-1}$ Pa with 80 W of power for 10 minutes. Ammonia or hydrazine may be used for nitriding. Here, aluminum oxynitride is deposited by nitriding aluminum oxide. However, aluminum oxynitride can be deposited directly as well.

Subsequently, activation of the channel region impurity is carried out by RTA at 800° C. for about 10 seconds in a nitrogen atmosphere. The number of bonds is decreased through this step, wherein the bonds are not terminated and are present at the interface between the silicon substrate 301 and the silicon oxide film 305. Consequently, reduction in the interface state density can be realized. A heat treatment is carried out at 400° C. in an oxygen atmosphere for 10 minutes to compensate oxygen vacancies in the aluminum oxynitride (N/(O+N)=1 percent) thin film.

Thereafter, TiN and W are formed all over the surface and serve as a gate electrode 307. CMP is carried out all over the surface and, thereby, the gate electrode and the metal oxynitride insulating film 306 are embedded in the groove, while the dummy gate has been removed from the groove, so that the gate electrode 307 is formed (FIG. 9D).

About 200 nm of silicon oxide film is deposited all over the surface and serves as an interlayer insulation film 310. Each contact hole is formed to reach the source-drain region 303.

Subsequently, Co and TiN (not shown in the drawing) and W are deposited, and are subjected to the RTA (Rapid Thermal Anneal) treatment in nitrogen at 700° C. for 10 seconds. Thereafter, patterning is carried out, so as to form a source electrode and a drain electrode 311. Annealing is further carried out at 400° C. for 10 minutes in an atmosphere in which a ratio of nitrogen to hydrogen is 9:1. Finally, a passivation film 312 is formed all over the surface, so as to prepare a transistor shown in FIG. 9E.

The inventors of the present invention verified that the performance of the thus formed transistor had characteristics equivalent to those of the transistor in the eighth embodiment, and the transistor exhibited proper operation.

In the case where a metal nitride, TiN, was used for the gate electrode as in the present invention, nitrogen was prevented from coming out of the metal nitride because aluminum oxynitride has high resistance to impurity diffusion. Consequently, the threshold was prevented from fluctuating due to the production process for the transistor following the formation of the gate electrode. Similar effects were observed in the case where the gate electrode was a nitride of Ti, Zr, Hf, W, or Ta, a compound thereof, or a laminate of some of them.

When nitrogen was removed after aluminum oxide was nitrided, while nitrogen was readily eliminated by a heat treatment, the silicon substrate was prevented from being nitrided during the process following the deposition of the gate insulating film. As a result, a transistor having an excellent mobility was surely realized.

INDUSTRIAL APPLICABILITY

According to the semiconductor device and the production method therefor of the present invention, it becomes possible to satisfy the characteristics required of a gate insulating film of a 0.05 μm-gate-length-generation semiconductor transistor. In particular, the fixed charge in the film can be reduced, the impurity diffusion can be suppressed and, thereby, the threshold shift and deterioration of the mobility can be prevented.

The invention claimed is:

1. A semiconductor device having an MIS (metal-insulating film-semiconductor) structure,
   wherein the semiconductor comprises a film consisting essentially of silicon, and the insulating film comprises a film consisting essentially of Al, O, and N atoms in the form of a solid solution of alumina and aluminum nitride, and
   wherein the insulating film has a nitrogen concentration ratio, based on a proportion of nitrogen atoms N/(N+O) in the insulating film, of between 0.1 percent and 10 percent.

2. The semiconductor device according to claim 1, wherein the semiconductor comprises silicon.

3. The semiconductor device according to claim 1, wherein the insulating film has a film thickness of 5 nm or less.

4. A semiconductor device having an MIS (metal-insulating film-semiconductor) structure,
wherein the semiconductor comprises a film consisting essentially of silicon, and the insulating film comprises $(1-x)AlO_{3/2} \cdot xAlN$ (where $0<x<1$) in the form of a solid solution of alumina and aluminum nitride, and
wherein the semiconductor is $Si_{(1-x'-y')} \cdot Ge_{x'} \cdot C_{y'}$, and wherein at least one of x' or y' is non-zero.

5. The semiconductor device according to claim 4, wherein the semiconductor comprises silicon.

6. The semiconductor device according to claim 4, wherein the insulating film has a nitrogen concentration ratio, based on the proportion of nitrogen atoms N/(N+O) in the insulating film, of between 0.1 percent and 10 percent.

7. The semiconductor device according to claim 4, wherein the insulating film has a film thickness of 5 cm or less.

8. A semiconductor device as claimed in claim 4, wherein the insulating film is $(1-y)\{(1-x)AlO_{3/2} \cdot xAlN\} \cdot YHfO_2$ ($0<x<1$, y is greater than 0 and equal to or smaller than 0.2).

9. A semiconductor device comprising a transistor including a source region, a drain region, a channel region sandwiched by the source region and the drain region, and a gate electrode provided on the channel region with an insulating film therebetween,
wherein the insulating film has a nitrogen concentration ratio, based on the proportion of nitrogen atoms N/(N+O) in the insulating film, of between 0.1 percent and 10 percent, and
wherein the channel region comprises a film consisting essentially of silicon, and the insulating film comprises a film consisting essentially of Al, O, and N atoms in the form of a solid solution of alumina and aluminum nitride.

10. The semiconductor device according to claim 9, wherein the channel region comprises silicon.

11. The semiconductor device according to claim 9, wherein the gate electrode comprises polycrystalline silicon or a silicon-germanium mixed crystal.

12. The semiconductor device according to claim 9, wherein the gate electrode comprises a metal nitride.

13. The semiconductor device according to claim 9, wherein the insulating film has a film thickness of 5 nm or less.

14. A semiconductor device as claimed in claim 9, wherein the insulating film is $(1-y)\{(1-x)AlO_{3/2} \cdot xAlN\} \cdot yHfO_2$ ($0<x<1$, y is greater than 0 and equal to or smaller than 0.2).

15. A semiconductor device comprising a transistor including a source region, a drain region, a channel region sandwiched by the source region and the drain region, and a gate electrode provided on the channel region with an insulating film therebetween,
wherein the gate electrode comprises a metal nitride, and
wherein the channel region comprises a film consisting essentially of silicon, and the insulating film comprises $(1-x)AlO_{3/2} \cdot xAlN$ (where $0<x<1$) in the form of a solid solution of alumina and aluminum nitride.

16. The semiconductor device according to claim 15, wherein the channel region comprises silicon.

17. The semiconductor device according to claim 15, wherein the insulating film has a nitrogen concentration ratio, based on the proportion of nitrogen atoms N/(N+O) in the insulating film, of between 0.1 percent and 10 percent.

18. The semiconductor device according to claim 15, wherein the insulating film has a film thickness of 5 nm or less.

19. A semiconductor device as claimed in claim 15, wherein the insulating film is $(1-y)\{(1-x)AlO_{3/2} \cdot xAlN\} \cdot YHfO_2$ ($0<x<1$, y is greater than 0 and equal to or smaller than 0.2).

20. A semiconductor device comprising a transistor including a source region, a drain region, a channel region sandwiched by the source region and the drain region, and a gate electrode provided on the channel region with a first insulating film and a second insulating film therebetween,
wherein the first insulating film comprises a silicon oxide film or a silicon oxynitride film,
wherein the gate electrode comprises a metal nitride, and
wherein the second insulating film comprises a film consisting essentially of Al, O, and N atoms in the form of a solid solution of alumina and aluminum nitride.

21. The semiconductor device according to claim 20, wherein the channel region comprises a film consisting essentially of silicon.

22. The semiconductor device according to claim 20, wherein the channel region comprises silicon.

23. The semiconductor device according to claim 20, wherein the first insulating film is present in the side nearer to the channel region than is the second insulating film.

24. A semiconductor device as claimed in claim 20, wherein the second insulating film is $(1-y)\{(1-x)AlO_{3/2} \cdot xAlN\} \cdot YHfO_2$ ($0<x<1$, y is greater than 0 and equal to or smaller than 0.2).

25. A semiconductor device as claimed in claim 20, wherein the second insulating film has a nitrogen concentration ratio, based on the proportion of nitrogen atoms N/(N+O) in the second insulating film, of between 0.1 percent and 10 percent.

26. A semiconductor device comprising a transistor including a source region, a drain region, a channel region sandwiched by the source region and the drain region, and a gate electrode provided on the channel region with a first insulating film and a second insulating film therebetween,
wherein the first insulating film comprises a silicon oxide film or a silicon oxynitride film, and
wherein the second insulating film comprises $(1-y)\{(1-x)AlO_{3/2} \cdot XAlN\} \cdot yHfO_2$ ($0<x1$, y is greater than 0 and equal to or smaller than 0.2) in the form of a solid solution of alumina and aluminum nitride.

27. The semiconductor device according to claim 26, wherein the channel region comprises a film consisting essentially of silicon.

28. The semiconductor device according to claim 26, wherein the channel region comprises silicon.

29. The semiconductor device according to claim 26, wherein the first insulating film is present in the side nearer to the channel region than is the second insulating film.

30. The semiconductor device according to claim 27, wherein the gate electrode comprises polycrystalline silicon or a silicon-gennanium mixed crystal.

31. The semiconductor device according to claim 26, wherein the gate electrode comprises a metal nitride.

32. A semiconductor device comprising a transistor including a source region, a drain region, a channel region sandwiched by the source region and the drain region, and a gate electrode provided on the channel region with an insulating film therebetween, wherein the channel region comprises a film consisting essentially of silicon, and the insulating film comprises a film consisting essentially of Al, O and N atoms in the form of a solid solution of alumina and aluminum nitride, and the gate electrode comprises a metal nitride.

33. A semiconductor device having an MIS (metal-insulating flim-semiconductor) structure,
wherein the semiconductor comprises a film consisting essentially of silicon, and the insulating film comprises $(1-x)AlO_{3/2}\cdot xAlN$ (where $0<x<1$) in the form of a solid solution of alumina and aluminum nitride, and
wherein the insulating film has a nitrogen concentration ratio, based on the proportion of nitrogen atoms $N/(N+O)$ in the insulating film, of between 0.1 percent and 10 percent.

34. A semiconductor device comprising a transistor including a source region, a drain region, a channel region sandwiched by the source region and the drain region, and a gate electrode provided on the channel region with an insulating film therebetween,
wherein the channel region comprises a film consisting essentially of silicon, and the insulating film comprises $(1-x)AlO_{3/2}\cdot xAlN$ (where $0<x<1$) in the form of a solid solution of alumina and aluminum nitride, and
wherein, the insulating film has a nitrogen concentration ratio, based on the proportion of nitrogen atoms $N/(N+O)$ in the insulating film, of between 0.1 percent and 10 percent.

35. A semiconductor device comprising a transistor including a source region, a drain region, a channel region sandwiched by the source region and the drain region, and a gate electrode provided on the channel region wit a first insulating film and a second insulating film therebetween,
wherein the first insulating film comprises a silicon oxide film or a silicon oxynitride film,
wherein the gate electrode comprises a metal nitride, and
wherein the second insulating film comprises $(1-x)AlO_{3/2}\cdot xAlN$ (where $0<x<1$) in the form of a solid solution of alumina and aluminum nitride.

36. A semiconductor device comprising a transistor including a source region, a drain region, a channel region sandwiched by the source region and the drain region, and a gate electrode provided on the channel region with a first insulating film and a. second insulating film therebetween,
wherein the first insulating film comprises a silicon oxide fun or a silicon oxynitride film, and
wherein the second insulating film comprises a film consisting essentially of Al, O, and N atoms in the form of a solid solution of alumina and aluminum nitride, and
wherein the second insulating film has a nitrogen concentration ratio, based on the proportion of nitrogen atoms $N/(N+O)$ in the second insulating film, of between 0.1 percent and 10 percent.

37. The semiconductor device according to claim 36, wherein the gate electrode comprises polycrystalline silicon or a silicon-germanium mixed crystal.

* * * * *